United States Patent
Venkataraghavan et al.

(10) Patent No.: US 9,621,130 B2
(45) Date of Patent: Apr. 11, 2017

(54) CONFIGURABLE GENERIC FILTER HARDWARE BLOCK AND METHODS

(71) Applicant: Avago Technologies General IP (Singapore) Pte. Ltd., Singapore (SG)

(72) Inventors: Parakalan Venkataraghavan, Allentown, PA (US); Sanal Cheruvathery, Bangalore (IN); Meng-Lin M. Yu, Morganville, NJ (US); Joseph Williams, San Jose, CA (US)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 381 days.

(21) Appl. No.: 14/318,938

(22) Filed: Jun. 30, 2014

(65) Prior Publication Data

US 2015/0381147 A1 Dec. 31, 2015

(51) Int. Cl.
*G06F 17/10* (2006.01)
*H03H 17/02* (2006.01)

(52) U.S. Cl.
CPC .... *H03H 17/0294* (2013.01); *H03H 17/0223* (2013.01); *H03H 2017/0298* (2013.01)

(58) Field of Classification Search
CPC ......... H03H 17/0223; H03H 17/0294
USPC .................................. 708/300–322
See application file for complete search history.

(56) References Cited

U.S. PATENT DOCUMENTS

| | | | |
|---|---|---|---|
| 6,493,467 B1* | 12/2002 | Okuda | G06T 1/20 382/260 |
| 2006/0195498 A1* | 8/2006 | Dobbek | G06F 9/30003 708/300 |
| 2007/0024499 A1* | 2/2007 | Bochkovskiy | G01S 19/29 342/357.68 |
| 2008/0151984 A1* | 6/2008 | Schmidt | H03H 17/0685 375/230 |

* cited by examiner

*Primary Examiner* — Tan V. Mai
(74) *Attorney, Agent, or Firm* — Sheridan Ross P.C.

(57) ABSTRACT

A configurable generic filter hardware block and corresponding methods are provided. A configurable generic filter hardware block includes a plurality of multipliers; a plurality of adders; and one or more multiplexers. The, configurable generic filter hardware block is configured using a header data structure, and the header data structure includes a pointer to a memory location storing a plurality of input samples, a pointer to a memory location storing a plurality of output samples and a coefficient selection control value. The configurable generic filter hardware block is optionally invoked by a convolution instruction in one or more of a vector processor and a state machine. An exemplary Generic Filter Iteration loads input samples; selects coefficients; convolves the input samples and the selected coefficients and stores output samples. The header data structures are optionally stored sequentially in memory and processed in a single loop.

22 Claims, 5 Drawing Sheets

FILTER PROCESSING LOOP 500

CONFIGURABLE GENERIC FILTER HARDWARE BLOCK AND METHODS

CROSS-REFERENCE TO RELATED APPLICATION

The present application is related to U.S. patent application Ser. No. 13/701,376, filed Apr. 24, 2013, entitled "Vector Processor Having Instruction Set With Vector Convolution Function For FIR Filtering," which claims priority to International Patent Application Serial No. PCT/US 12/62182, entitled "Vector Processor Having Instruction Set With Vector Convolution Function For FIR Filtering," and U.S. Patent Provisional Application Ser. No. 61/552,242, filed Oct. 27, 2011, entitled "Software Digital Front End (SoftDFE) Signal Processing and Digital Radio," each incorporated by reference herein.

FIELD OF THE INVENTION

The present invention is related to digital signal processing techniques and, more particularly, to techniques for digital filtering.

BACKGROUND

Finite Impulse Response (FIR) digital filtering is used in many signal processing applications. A data stream is often filtered in multiple stages, with the output of one filter serving as the input of another filter. In addition, a plurality of such data streams may need to be processed in parallel. A typical filtering operation typically comprises a processing loop where the input data stream and filter coefficients are read, and convolved to produce the output data.

Filtering performance can be improved to meet higher throughput requirements, for example, by increasing the clock frequency of the processing hardware. The clock frequency, however, will be constrained by a physical limit. The filtering performance can also be improved, for example, using a vector approach to exploit data-level parallelism of the filtering operation. A vector approach processes multiple samples (i.e., a vector) in one cycle by adding additional parallel hardware (e.g., multipliers and accumulators). A vector approach is possible if the data and coefficients are stored in contiguous locations.

For each filter, the processing loop has a fixed overhead in the number of cycles before the loop attains steady state, which increases with the depth of the pipeline. Also, with a vector approach, this fixed overhead becomes a higher fraction of the overall processing cycles. Thus, for a plurality of filters, each filter requires a separate processing loop, and the overall processing efficiency decreases. In applications requiring low latency, e.g., a Digital Front End (DFE) of a wireless base station, the input block sizes are small, so the number of iterations in each loop is also fairly small. Thus, the number of loop overhead cycles is comparable to (or sometimes greater than) the actual number of processing cycles.

A need therefore exists for filtering techniques that improve processing efficiency by reducing the number of loops. A further need exists for filtering techniques that improve processing efficiency by reducing the number of loops to a single loop.

SUMMARY

Generally, a configurable generic filter hardware block and corresponding methods are provided that improve processing efficiency by reducing the number of loops. According to one aspect of the invention, a configurable generic filter hardware block comprises a plurality of multipliers; a plurality of adders; and one or more multiplexers, wherein the configurable generic filter hardware block is configured using a header data structure, the header data structure comprises a pointer to a memory location storing a plurality of input samples, a pointer to a memory location storing a plurality of output samples and a coefficient selection control value. The header data structure also comprises, for example, an accumulation control value and/or an input/output data selection value.

In one exemplary embodiment, the configurable generic filter hardware block is invoked by a convolution instruction in one or more of a vector processor and a state machine. An exemplary Generic Filter Iteration comprises loading a plurality of input samples; selecting a plurality of coefficients; convolving the plurality of input samples and the plurality of selected coefficients and storing a plurality of output samples. Each of the exemplary Generic Filter Iterations has a corresponding header data structure. The header data structures are optionally stored sequentially in memory and processed in a single loop. The header data structures are optionally sequenced to reduce dependencies and can be precomputed off-line.

A more complete understanding of the present invention, as well as further features and advantages of the present invention, will be obtained by reference to the following detailed description and drawings.

DETAILED DESCRIPTION

Aspects of the present invention provide a configurable generic filter hardware block and methods for configuring and employing the configurable generic filter hardware block. The configurable generic filter hardware block comprises a plurality of multipliers and adders and one or more multiplexers and is configured using a header data structure. In one exemplary embodiment, the header data structure comprises a pointer to an input sample buffer, a pointer to an output sample buffer and a coefficient selection control value. While the present invention is illustrated herein in the context of a Digital Front End (DFE) of a wireless base station, and particularly for performing filtering in a Digital Upconversion stage, the present invention is applicable to any filtering applications.

Figure 1:
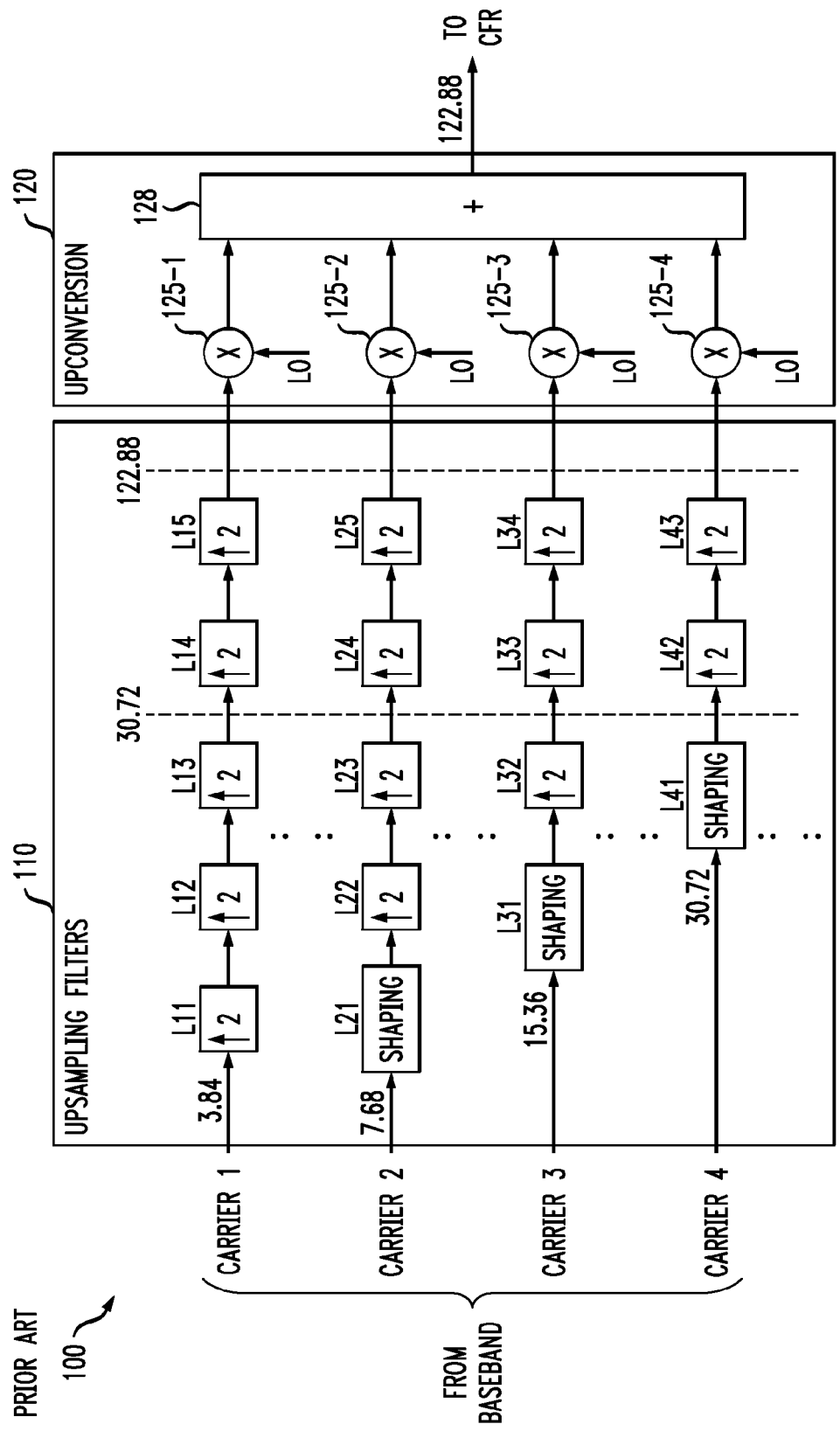
FIG. 1 is a schematic block diagram of a portion of a conventional Digital Front End (DFE) of a wireless base station.

FIG. 1 is a schematic block diagram of a portion of a conventional Digital Front End (DFE) 100 of a wireless base station. Generally, the portion of the conventional Digital Front End (DFE) 100 corresponds to a digital up-conversion portion of the DFE. As shown in FIG. 1, the exemplary conventional Digital Front End 100 comprises an upsampling filter stage 110 and an up-conversion stage 120. The exemplary upsampling filter stage 110 comprises a first plurality of filters L11 . . . L15 for processing a first carrier signal, a second plurality of filters L21 . . . L25 for processing a second carrier signal, a third plurality of filters L31 . . . L34 for processing a third carrier signal, and a fourth plurality of filters L41 . . . L43 for processing a fourth carrier signal. For example, the exemplary first carrier signal received from baseband (not shown) has a frequency of, for example, 3.84 MSps for the first carrier signal. After the first carrier signal is processed by three filters L11-L13, the first carrier signal has a frequency of 30.72 MSps, and after the first carrier signal is processed by filters L41-L43, the upsampled first carrier signal has a frequency of 122.88 MSps.

The exemplary upconversion stage 120 comprises a plurality of multipliers 125-1 through 125-4 for multiplying each upsampled carrier signal by a local oscillator (LO) signal and an adder 128 to combine the outputs of the multipliers 125-1 through 125-4 to produce a combined carrier signal having a frequency of 122.88 MSps. The output of the adder 128 is optionally provided to a crest factor reduction (CFR) stage (not shown).

Figure 2:
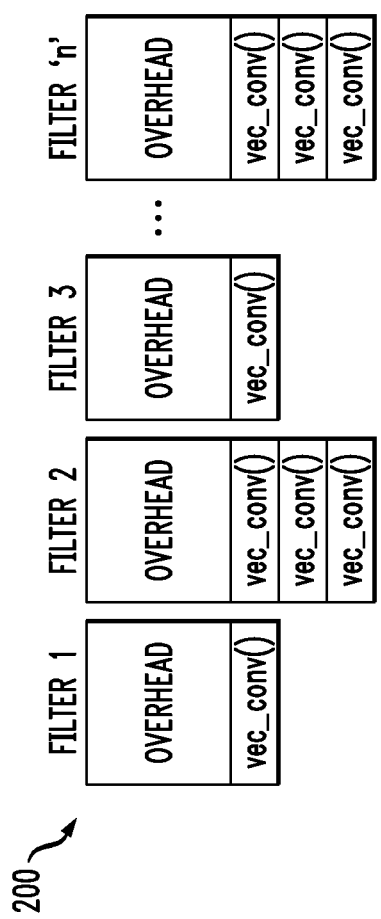
FIG. 2 illustrates a conventional filtering technique where filter operations for a plurality of filters 1 through n are performed.

FIG. 2 illustrates a conventional filtering technique where filter operations for a plurality of filters 1 through n are performed. As shown in FIG. 2, each filter i has a corresponding processing loop where one or more filter operations are performed. Each filter operation (vec_conv) comprises convolving the input data stream with filter coefficients to produce output data. For each filter i, the processing loop has a fixed overhead in the number of cycles before the loop attains steady state, which typically increases with the depth of the pipeline. The overhead incurred for each filter impairs overall performance.

Aspects of the invention provide a configurable generic filter hardware block and associated methods that improve processing efficiency by reducing the number of loops. In one exemplary embodiment, processing efficiency is improved by reducing the number of loops to a single loop. As noted above, the configurable generic filter hardware block is configured using a header data structure. In one exemplary embodiment, the header data structure comprises a pointer to an input sample buffer, a pointer to an output sample buffer and a coefficient selection control value.

Additional aspects of the present invention extend conventional vector processors to provide an enhanced instruction set that supports vector convolution functions. A vector processor in accordance with exemplary aspects of the present invention receives an input vector having real or complex inputs, applies a complex vector convolution function to the input and generates a vector having one output value for each time shift. A vector convolve software instruction keyword is optionally part of an instruction set of a vector processor and/or a state machine.

According to another aspect of the invention, a Generic Filter Iteration routine is provided to configure the configurable generic filter hardware block based on a corresponding header data structure for a given filter operation. The exemplary Generic Filter Iteration routine comprises the steps of (i) loading a plurality of input samples based on the pointer to the input sample buffer identified in the header data structure; (ii) selecting a plurality of coefficients based on the coefficient selection control value in the header data structure; (iii) convolving the plurality of input samples and the plurality of selected coefficients (optionally performed multiple times with accumulation, if needed); and (iv) storing a plurality of output samples based on the pointer to the output sample buffer identified in the header data structure. In one exemplary embodiment the plurality of coefficients are selected by loading the plurality of coefficients from a memory based on the coefficient selection control value in the header data structures. The filter state is also optionally stored after each exemplary Generic Filter Iteration. For example, the last L-1 input samples from the prior iteration are needed for the next iteration, where L is the length of the filter.

The convolve operation in the exemplary Generic Filter Iteration routine is optionally performed in response to the vector convolve software instruction keyword to invoke the configurable generic filter hardware block. Generally, if a vector processor is processing software code that includes a predefined instruction keyword corresponding to a vector convolution function and the appropriate operands for the function (i.e., the input samples), the instruction decoder must invoke the configurable generic filter hardware block to process the vector convolution instruction.

Figure 3:
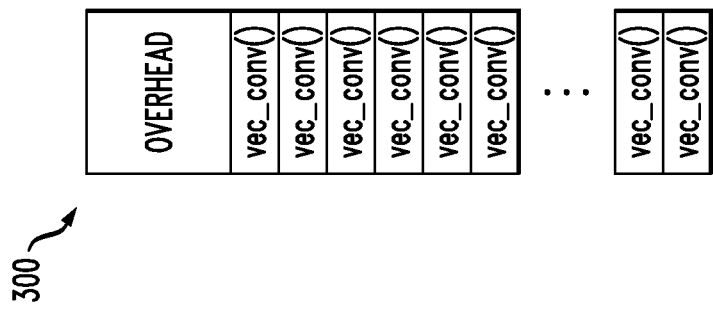
FIG. 3 illustrates a plurality of filter operations performed in a single processing loop in accordance with an exemplary embodiment of the invention.

FIG. 3 illustrates a plurality of filter operations performed in a single processing loop 300 in accordance with an exemplary embodiment of the invention. Generally, the single processing loop 300 combines all of the filter operations (vec_conv) using a set of the headers, as discussed further below in conjunction with FIG. 4. In this manner, the fixed overhead for the single loop is incurred only once, compared to the conventional approach of FIG. 2.

Figure 4:
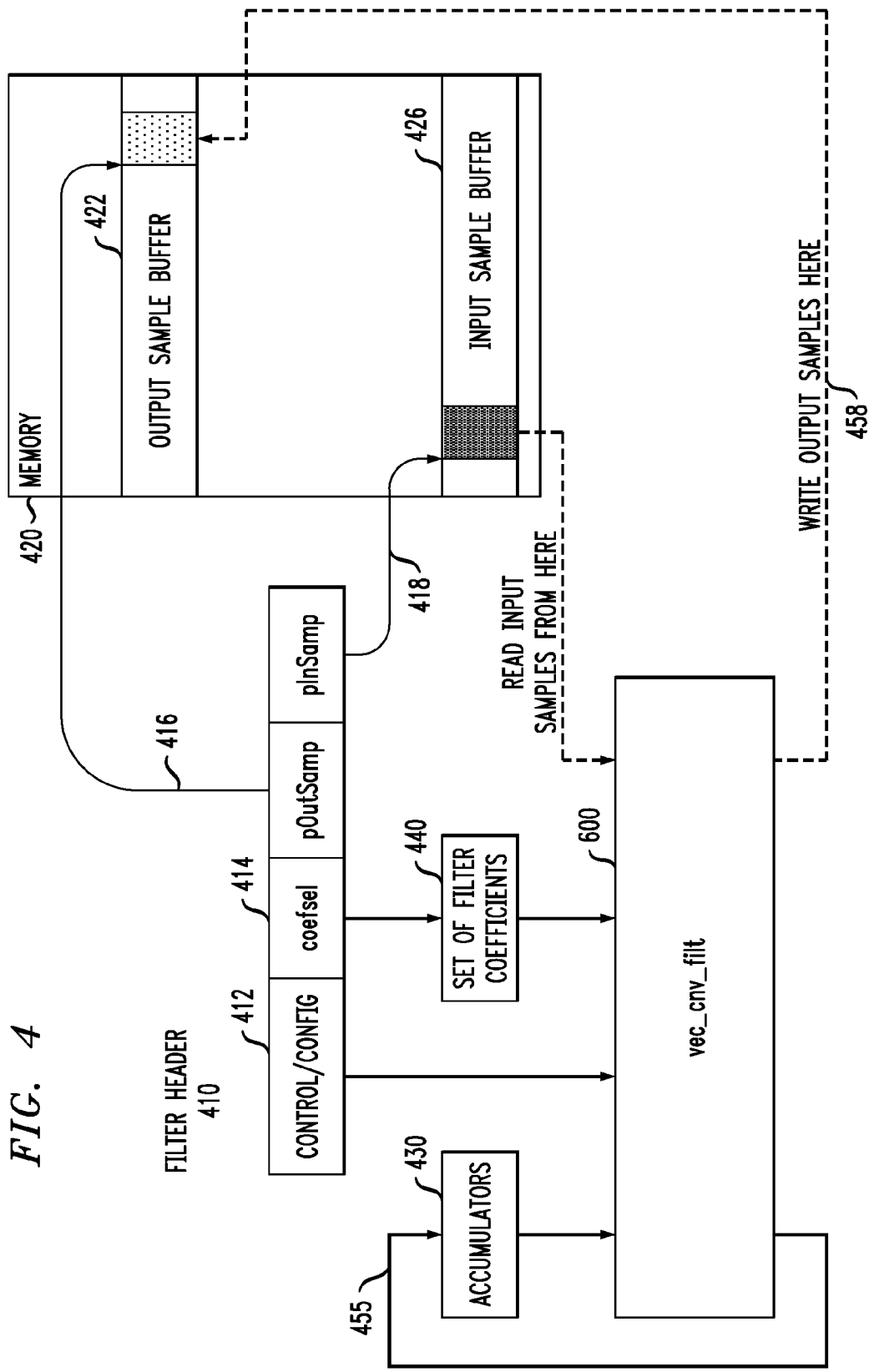
FIG. 4 is a schematic block diagram illustrating a configurable generic filter hardware block in accordance with the present invention that is configured by a filter header.
Figure 6:
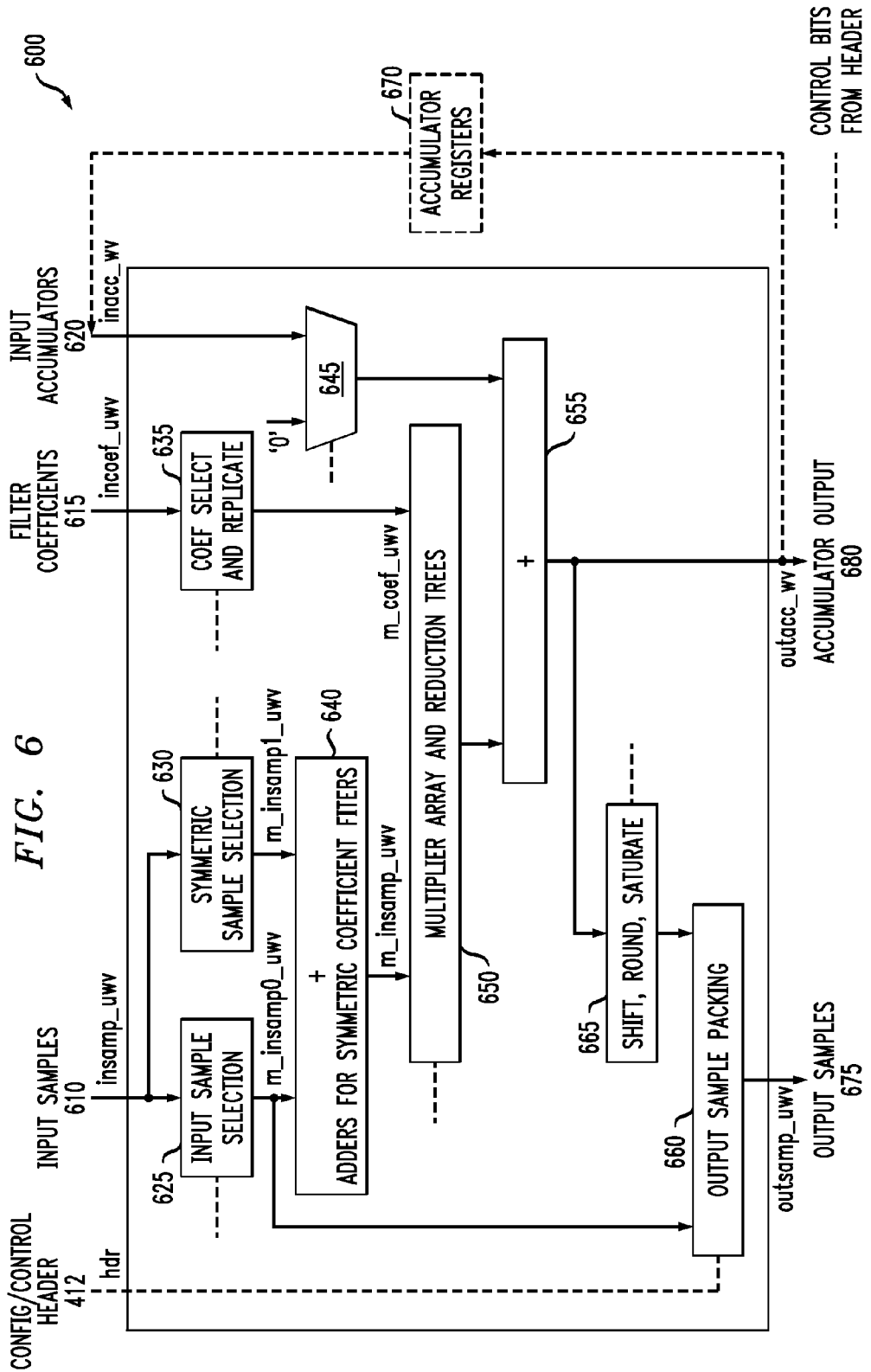
FIG. 6 illustrates the configurable generic filter hardware block of FIG. 4 in further detail.

FIG. 4 is a schematic block diagram illustrating a configurable generic filter hardware block 600 in accordance with the present invention that is configured by a filter header 410. The configurable generic filter hardware block 600, discussed further below in conjunction with FIG. 6, is configurable, in terms of input/output selection, formatting, and data type selection (real/complex). The behavior of the configurable generic filter hardware block 600 is customized based on the set of control/configuration inputs in the filter header 410.

As shown in FIG. 4, the exemplary filter header 410 comprises a configuration and control information field 412 (e.g., (accumulation control and input/output data selection); a coefficient selection control value 414; a pointer 416 to an output sample buffer 422 of memory 420 and a pointer 418 to an input sample buffer 426 of memory 420. As indicated above, the filter header 410 defines how the configurable generic filter hardware block 600 is configured for one exemplary Generic Filter Iteration.

As shown in FIG. 4, the coefficient selection control value 414 may be used as an index into a set 440 of filter coefficients. In a further variation, the coefficient selection control value 414 can serve as a pointer to obtain the filter coefficients from memory.

The output samples 458 of the configurable generic filter hardware block 600 are normally stored in the output sample buffer 422, as identified by pointer 416. In an accumulation mode, however, the output 455 of the configurable generic filter hardware block 600 is fed back to one or more accumulators 430.

The filter header 410 are optionally precomputed for each call of the Generic Filter Iteration, which can optionally be done offline, and stored in memory. In this manner, the processing efficiency is increased, without increasing the hardware complexity, since the headers are precomputed offline and stored in memory.

As indicated above, the configurable generic filter hardware block 600 can be used as an instruction "vec_cnv_filt" in a vector processor.

Figure 5:
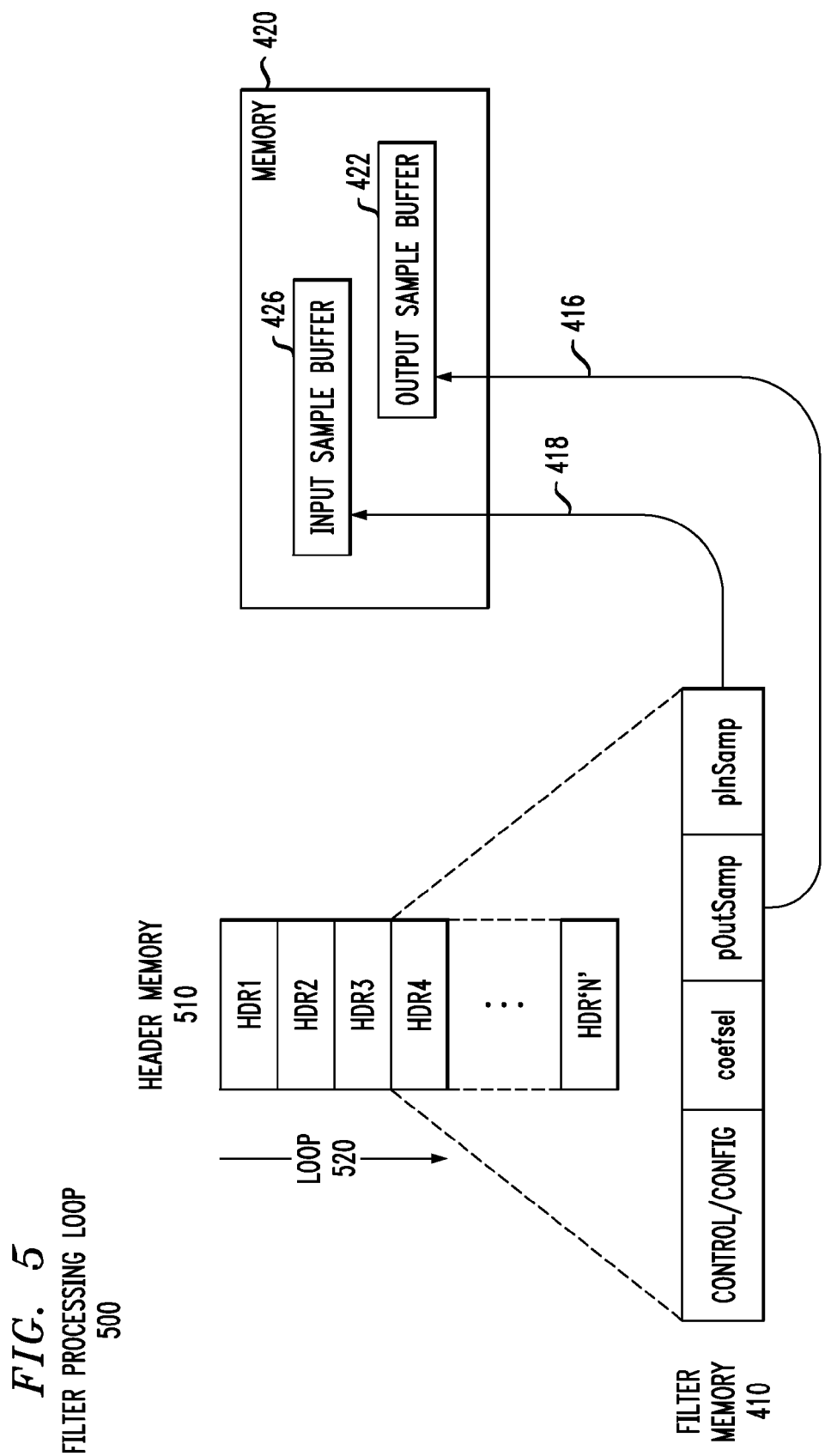
FIG. 5 illustrates a sequence of headers stored in a header memory.

FIG. 5 illustrates a sequence of headers hdr 1-N stored in a header memory 510. The sequence of headers 1-N are optionally processed in sequence in a loop 520. As shown in FIG. 5, each header hdr has the same format as the filter header 410 of FIG. 4 with a pointer 416 to an output sample buffer 422 of memory 420 and a pointer 418 to an input sample buffer 426 of memory 420.

FIG. 6 illustrates the configurable generic filter hardware block 600 of FIG. 4 in further detail. Generally, as indicated above, the configurable generic filter hardware block 600 comprises a plurality of multipliers and adders and one or more multiplexers. In addition, the configurable generic filter hardware block 600 is configured using the filter header 410 of FIG. 4.

As shown in FIG. 6, the configuration and control information field 412 (e.g., (accumulation control and input/output data selection) is applied to an output sample packing block 660. The input samples 610 are applied to an input sample selection block 625 and a symmetric sample selection block 630. The input sample selection block 625 selects the input samples 610 based on the input sample pointer 418. The symmetric sample selection block 630 optionally exploits filter symmetry. The selected input samples are applied to adders 640 and the output of adders 640 are applied to a multiplier array and reduction trees block 650.

The filter coefficients 615 are applied to a coefficient selection and replication block 635. The coefficient selection and replication block 635 selects the filter coefficients based on the coefficient selection control value 414. The selected filter coefficients are applied to the multiplier array and reduction trees block 650. The output of the multiplier array and reduction trees block 650 is applied to an adder 655.

In an accumulation mode, input accumulators 620, which are obtained from accumulator registers 670 are applied to an input of a multiplexer 645. The multiplexer 645 selects an input based on the accumulation control in the configuration and control information field 412.

As shown in FIG. 6, the output of adder 655 is applied to a shift, round saturate block 665 and as the accumulator output 680. The output of the shift, round saturate block 665 is applied to the output sample packing block 660 which produces output samples 675.

Thus, aspects of the present invention recognize that any filter can be implemented as a sequence of multiple calls of the configurable generic filter hardware block 600. A unique filter header 410 is computed for each call of the exemplary Generic Filter Iteration routine. Each filter header 410 is optionally pre-computed offline. Each iteration invokes the configurable generic filter hardware block 600. The headers 410 are optionally stored sequentially in memory and processed in a single loop, which is optionally software pipelined.

The headers 410 of different carriers and/or filters are optionally arranged in an appropriate sequence to avoid dependencies. In this manner, pipeline stalls due to filter input/output dependencies can be minimized, if not eliminated. For example, in the exemplary conventional Digital Front End 100 of FIG. 1, the plurality of filters for a given carrier depend on the output of the prior filter in the sequence. For example, filter L12 depends on the output of filter L11. Thus, a subsequent filter of a given carrier cannot begin processing until the processing of a prior filter in the chain has completed. The filters for one carrier, however, do not depend on the output of the filters for a different carrier.

For example, filters L11 through L15 do not depend on the output of filters L21 through L25.

Thus, another aspect of the invention sequences the header data structures to reduce dependencies. For example, the first filter for each carrier can be processed in sequence, before the second filter for each carrier is processed.

CONCLUSION

While exemplary embodiments of the present invention have been described with respect to digital logic blocks and memory tables within a digital processor, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit or micro-controller. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, wherein, when the program code is loaded into and executed by a machine, such as a processor, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital processor, a microprocessor, and a micro-controller.

It is to be understood that the embodiments and variations shown and described herein are merely illustrative of the principles of this invention and that various modifications may be implemented by those skilled in the art without departing from the scope and spirit of the invention.

What is claimed:

1. A configurable filter hardware block, comprising:
   a plurality of multipliers;
   a plurality of adders connected to the plurality of multipliers; and
   one or more multiplexers connected to at least one of the plurality of adders, wherein said configurable filter hardware block is configured using a header data structure, said header data structure comprises a pointer to a memory location storing a plurality of input samples, a pointer to a memory location storing a plurality of output samples and a coefficient selection control value.

2. The configurable filter hardware block of claim 1, wherein said header data structure further comprises one or more of an accumulation control value and an input/output data selection value.

3. The configurable filter hardware block of claim 1, wherein said configurable filter hardware block is invoked by a convolution instruction in one or more of a vector processor and a state machine.

4. The configurable filter hardware block of claim 1, further comprising a Generic Filter Iteration to perform the following steps: loading said plurality of input samples; selecting a plurality of coefficients; convolving said plurality of input samples and said plurality of selected coefficients and storing a plurality of output samples.

5. The configurable filter hardware block of claim 4, wherein said configurable filter hardware block is invoked by said convolving step in said Generic Filter Iteration a plurality of times in a single loop for a plurality of filters.

6. The configurable filter hardware block of claim 4, wherein each of said Generic Filter Iterations has a corresponding one of said header data structures.

7. The configurable filter hardware block of claim 6, wherein said header data structures are stored sequentially in memory and processed in a single loop.

8. The configurable filter hardware block of claim 7, wherein said header data structures are sequenced to reduce dependencies.

9. The configurable filter hardware block of claim 6, wherein said header data structures are precomputed off-line.

10. A method for performing a plurality of filter operations, said method comprising:
    providing a configurable filter hardware block comprising a plurality of multipliers, a plurality of adders and one or more multiplexers, wherein the plurality of multipliers are connected to the plurality of adders and the one or more multiplexers are connected to at least one of the plurality of adders, wherein said configurable filter hardware block is configured using a header data structure, wherein said header data structure comprises a pointer to a memory location storing a plurality of input samples, a pointer to a memory location storing a plurality of output samples and a coefficient selection control value; and
    performing a Generic Filter Iteration routine comprising the following steps to configure said configurable filter hardware block based on one of said header data structures for a given one of said plurality of filter operations:
        loading a plurality of input samples based on said one of said header data structures;
        selecting a plurality of coefficients based on said one of said header data structures;
        convolving said plurality of input samples and said plurality of selected coefficients; and
        storing a plurality of output samples based on said pointer to a memory location storing a plurality of output samples in said one of said header data structures.

11. The method of claim 10, wherein said step of selecting a plurality of coefficients further comprises the step of loading said plurality of coefficients from a memory based on said one of said header data structures.

12. The method of claim 10, wherein said convolving step is performed in response to a vector convolve software instruction keyword to invoke said configurable filter hardware block.

13. The method of claim 12, wherein said vector convolve software instruction keyword is part of an instruction set of one or more of a vector processor and a state machine.

14. The method of claim 10, wherein said method is invoked by said convolving step in said Generic Filter Iteration a plurality of times in a single loop for a plurality of filters.

15. The method of claim 10, wherein each of said Generic Filter Iterations has a corresponding one of said header data structures.

16. The method of claim 15, wherein said header data structures are stored sequentially in memory and processed in a single loop.

17. An apparatus that performs a plurality of filter operations, comprising:
    a configurable filter hardware block comprising a plurality of multipliers, a plurality of adders and one or more multiplexers, wherein the plurality of multipliers are connected to the plurality of adders and the one or more multiplexers are connected to at least one of the plurality of adders, wherein said configurable filter hardware block is configured using a header data structure; and
    at least one hardware device operative to:
        perform a Generic Filter Iteration routine comprising the following steps to configure said configurable filter hardware block based on one of said header data structures for a given one of said plurality of filter operations:
            load a plurality of input samples based on said one of said header data structures; select a plurality of coefficients based on said one of said header data structures; convolve said plurality of input samples and said plurality of selected coefficients; and
            store a plurality of output samples based on said pointer to a memory location storing a plurality of output samples in said one of said header data structures.

18. The apparatus of claim 17, wherein said step of selecting a plurality of coefficients further comprises the step of loading said plurality of coefficients from a memory based on said one of said header data structures.

19. The apparatus of claim 17, wherein said convolve operation is performed in response to a vector convolve software instruction keyword to invoke said configurable filter hardware block.

20. The apparatus of claim 17, wherein said at least one hardware device comprises one or more of a vector processor and a state machine.

21. The apparatus of claim 17, wherein each of said Generic Filter Iterations has a corresponding one of said header data structures.

22. The apparatus of claim 21, wherein said header data structures are stored sequentially in memory and processed in a single loop.

* * * * *